(12) United States Patent
Chuang et al.

(10) Patent No.: US 12,471,277 B2
(45) Date of Patent: Nov. 11, 2025

(54) MEMORY DEVICE AND METHOD OF MANUFACTURING THE SAME

(71) Applicant: Winbond Electronics Corp., Taichung (TW)

(72) Inventors: Che-Fu Chuang, Taichung (TW); Yao-Ting Tsai, Taichung (TW); Hsiu-Han Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 21 days.

(21) Appl. No.: 18/617,590

(22) Filed: Mar. 26, 2024

(65) Prior Publication Data

US 2024/0244838 A1    Jul. 18, 2024

Related U.S. Application Data

(62) Division of application No. 17/564,259, filed on Dec. 29, 2021, now Pat. No. 11,974,428.

(51) Int. Cl.
| | |
|---|---|
| H10D 30/68 | (2025.01) |
| H10B 41/30 | (2023.01) |
| H10D 30/01 | (2025.01) |
| H10D 64/01 | (2025.01) |
| H10D 64/23 | (2025.01) |

(52) U.S. Cl.
CPC ......... *H10B 41/30* (2023.02); *H10D 30/0411* (2025.01); *H10D 30/683* (2025.01); *H10D 64/01* (2025.01); *H10D 64/251* (2025.01)

(58) Field of Classification Search
None
See application file for complete search history.

(56) References Cited

U.S. PATENT DOCUMENTS

2016/0365313 A1* 12/2016 Zhang ............... H01L 21/76816
2019/0319034 A1* 10/2019 Lee ..................... H10B 41/10

* cited by examiner

*Primary Examiner* — Xiaoming Liu
(74) *Attorney, Agent, or Firm* — JCIPRNET

(57) ABSTRACT

Provided are a memory device and a method of manufacturing the same. The memory device includes: a stack structure; a first source/drain region and a second source/drain region located in a substrate beside the stack structure; a first self-aligned contact connected to the first source/drain region; a second self-aligned contact connected to the second source/drain region; a first liner structure located between the first self-aligned contact and a first sidewall of the stack structure; and a second liner structure located between the second self-aligned contact and a second sidewall of the stack structure. The first liner structure and the second liner structure are not connected and do not cover the stack structure.

12 Claims, 10 Drawing Sheets

MEMORY DEVICE AND METHOD OF MANUFACTURING THE SAME

CROSS-REFERENCE TO RELATED APPLICATION

This application is a divisional application of and claims the priority benefit of a prior application Ser. No. 17/564,259, filed on Dec. 29, 2021. The entirety of the above-mentioned patent application is hereby incorporated by reference herein and made a part of this specification.

BACKGROUND

Technical Field

The disclosure relates to a flash memory device and a method of manufacturing the same.

Description of Related Art

Flash memory has become a widely used in memory devices since data stored in the flash memory does not disappear even power is off. There must be enough distance between gate and source contact (or drain contact) of the flash memory to be electrically isolated. If the distance is too close, it is easy to cause leakage current and cause the problem of reduction of device reliability.

SUMMARY

The disclosure provides a flash memory device and a method of manufacturing the same, which can have a larger process window when a self-aligned contact is formed, and can make a sufficient distance between contact and gate (word line) to prevent or reduce the leakage current of the gate, and improve the reliability of the device.

The disclosure provides a memory device, including a substrate, a first source/drain (S/D) region and a plurality of second source/drain regions, a stack structure, a first dielectric layer, a first self-aligned contact, a plurality of second self-aligned contacts, a first liner structure, and a second liner structure. The substrate has a plurality of isolating structures. The first source/drain region and the second source/drain regions are located in the substrate. The stack structure is located on the substrate between the first source/drain region and the second source/drain regions. The first dielectric layer is located on the substrate, and includes a plurality of dielectric columns. The dielectric columns are separated from each other, and are located on the isolating structures. The first self-aligned contact is located on the substrate and connected to the first source/drain region. The second self-aligned contacts are located between the dielectric columns on the substrate and connected to the second source/drain regions. The first liner structure is located between the first self-aligned contact and a first sidewall of the stack structure. The second liner structure is located between the second self-aligned contacts and a second sidewall of the stack structure. The first liner structure and the second liner structure are not connected, and do not cover the stack structure.

The disclosure also provides a method of manufacturing a memory device. The method includes the following steps. A plurality of stack structures are formed on a substrate. A plurality of first source/drain regions and a plurality of second source/drain regions are formed in the substrate. Each of the first source/drain regions extends along a first direction. The second source/drain regions are arranged along the first direction. A liner structure is formed on top surfaces and sidewalls of the stack structures and a surface of the substrate between the stack structures. A plurality of sacrificial walls are formed on the liner structure between the stack structures. Parts of the sacrificial walls are patterned to form a plurality of first openings and a plurality of sacrificial columns alternating with each other. The sacrificial columns correspond to the second source/drain regions. The first openings correspond to a plurality of isolating structures between the second source/drain regions. A first dielectric layer is formed on the substrate and filled in the first openings to form a plurality of dielectric columns. The sacrificial walls and the sacrificial columns located above and the liner structure there below are removed to form a plurality of first self-aligned contact openings exposing the first source/drain regions and a plurality of second self-aligned contact openings exposing the second source/drain regions. A plurality of first self-aligned contacts and a plurality of second self-aligned contacts are respectively formed in the first self-aligned contact openings and the second self-aligned contact openings.

In the method of manufacturing a memory device of the embodiments of the disclosure, which a larger process window can have when the self-aligned contact is formed, and can make a sufficient distance between the contact and gate, to prevent or reduce the leakage current of the gate, and improve the reliability of the device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
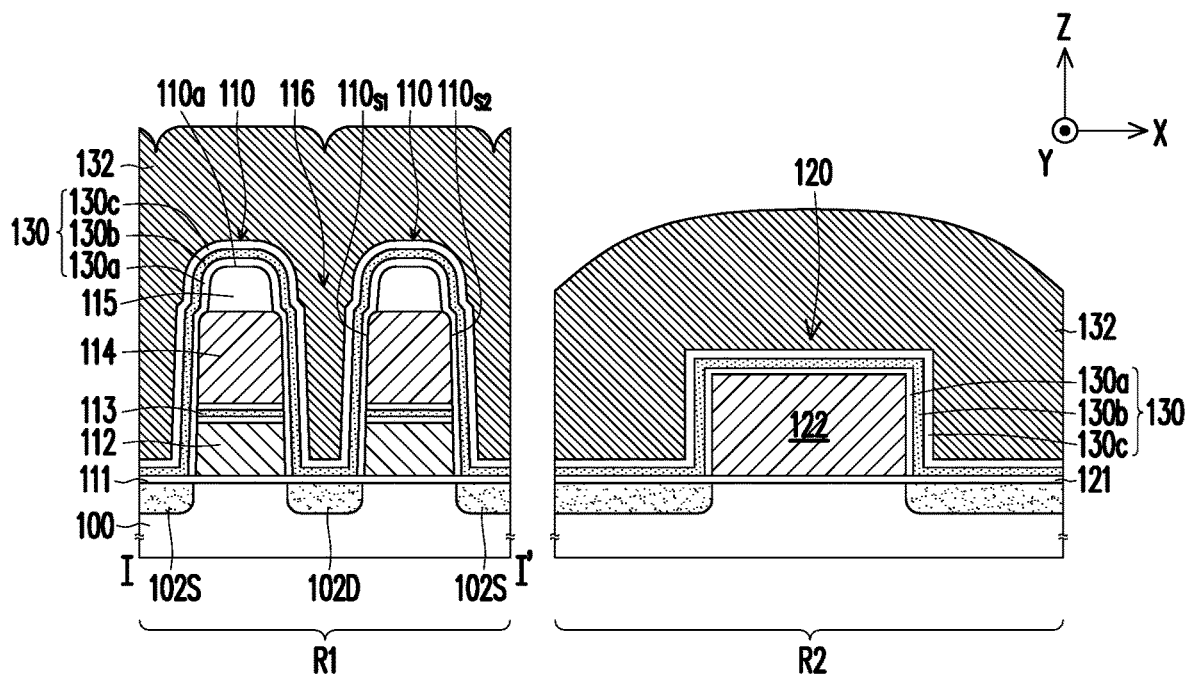
FIG. 1A to FIG. 1N are schematic cross-sectional views of a method of manufacturing NOR flash memory according to an embodiment of the disclosure.

With reference to FIG. 1A, a method of manufacturing NOR flash memory includes steps as follows. A substrate 100 is provided. The substrate 100 is, for example, a silicon substrate. The substrate 100 has a cell region R1 and a peripheral region R2. A plurality of isolating structures 104 are formed in the substrate 100. A plurality of stack structures 110 extending along an X direction are formed on the substrate 100 of the cell region R1, and a stack structure 120 extending along the X direction is formed on the substrate 100 of the peripheral region R2.

The stack structure 110 includes, for example, a tunneling dielectric layer 111, a floating gate 112, an inter-gate dielectric layer 113, a control gate 114, and a top cover layer 115 sequentially stacked on the substrate 100 along a Z direction. The tunneling dielectric layer 111 is, for example, silicon oxide. The floating gate 112 is, for example, doped polycrystalline silicon. The inter-gate dielectric layer 113 is, for example, a composite layer of silicon oxide, silicon nitride, and silicon oxide (ONO). The control gate 114 is, for example, doped polycrystalline silicon. The top cover layer 115 is, for example, silicon oxide. The control gate 114 and the top cover layer 115 may be strip-shaped structures along a direction into the paper surface.

The stack structure 120 includes a gate dielectric layer 121 and a gate conductive layer 122 stacked along the Z direction. The gate dielectric layer 121 is, for example, silicon oxide, silicon oxynitride, silicon nitride, or a combination thereof. The gate conductive layer 122 is, for example, doped polycrystalline silicon.

Figure 2A:
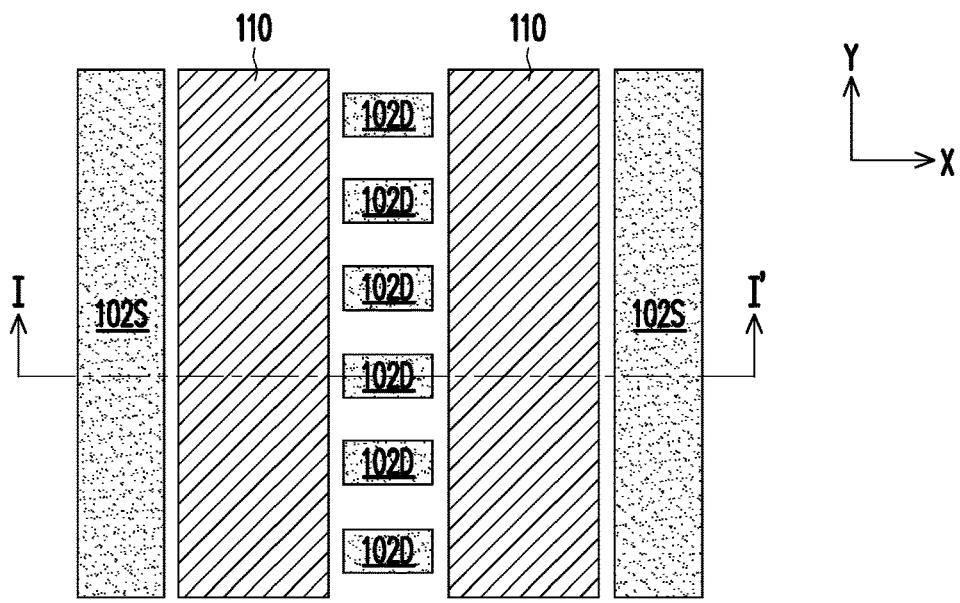
FIG. 2A to FIG. 2C are top views of a method of manufacturing NOR flash memory according to an embodiment of the disclosure.

With reference to FIG. 1A and FIG. 2A, an ion implantation process is performed on the substrate 100 of the cell region R1 to form one 102S of a source/drain (S/D) region and a plurality of 102D of the S/D region on both sides of each stack structure 110. The 102S of the S/D region may be serve as a source region, and may thus be abbreviated as a source region 102S; the 102D of the S/D region may serve as a drain region, and may thus be abbreviated as a drain region 102D. As shown in FIG. 2A, the source region 102S may be a strip-shaped structure extending along a Y direction, and the drain regions 102D may be a plurality of block-shaped structures arranged along the Y direction and sandwiched between two adjacent stack structures 110. The source region 102S and the drain region 102D are, for example, N-type or P-type doped regions. In FIG. 2A, only some of the members are shown. The cell region R1 of FIG. 1A is a cross-sectional view of line I-I' of FIG. 2A.

With reference to FIG. 1A, a liner structure 130 is formed on the substrate 100 entirely. The liner structure 130 may be conformally formed on the stack structures 110 of the cell region R1, and formed on the gate conductive layer 122 of the peripheral region R2. The liner structure 130 may cover a top surface 110a and sidewalls $110_{s1}$ and $110_{s2}$ of the stack structure 110 and the surface of the substrate 100 adjacent to the stack structure 110. In the cell region R1, the liner structure 130 is conformally formed on the stack structures 110, and does not fill up the gap between the stack structures 110, thus forming an opening 116. Mobile ions described herein are, for example, Fe, Cu, Al, In, and Co, among other ions. Since the top surface 110a and the sidewalls $110_{s1}$ and $110_{s2}$ of the stack structure 110 are covered by the liner structure 130, the liner structure 130 can protect the stack structure 110 by reducing or preventing interference by ions, and reducing or preventing diffusion of ions into the stack structure 110, which causes damage to the memory device.

The liner structure 130 may include a different material from that of the top cover layer 115. The liner structure 130 may be a dielectric material, such as oxide or nitride. The liner structure 130 may be single-layer or multi-layer. The liner structure 130 may be liners 130a, 130b, and 130c sequentially stacked on the stack structure 110. The liners 130a/130b/130c are, for example, silicon oxide/silicon nitride/silicon oxide layers.

After that, a sacrificial material layer 132 is formed on the substrate 100 entirely to be filled in the opening 116 between the stack structures 110 and to cover the liner structure 130. The sacrificial material layer 132 is, for example, polycrystalline silicon.

Figure 1B:
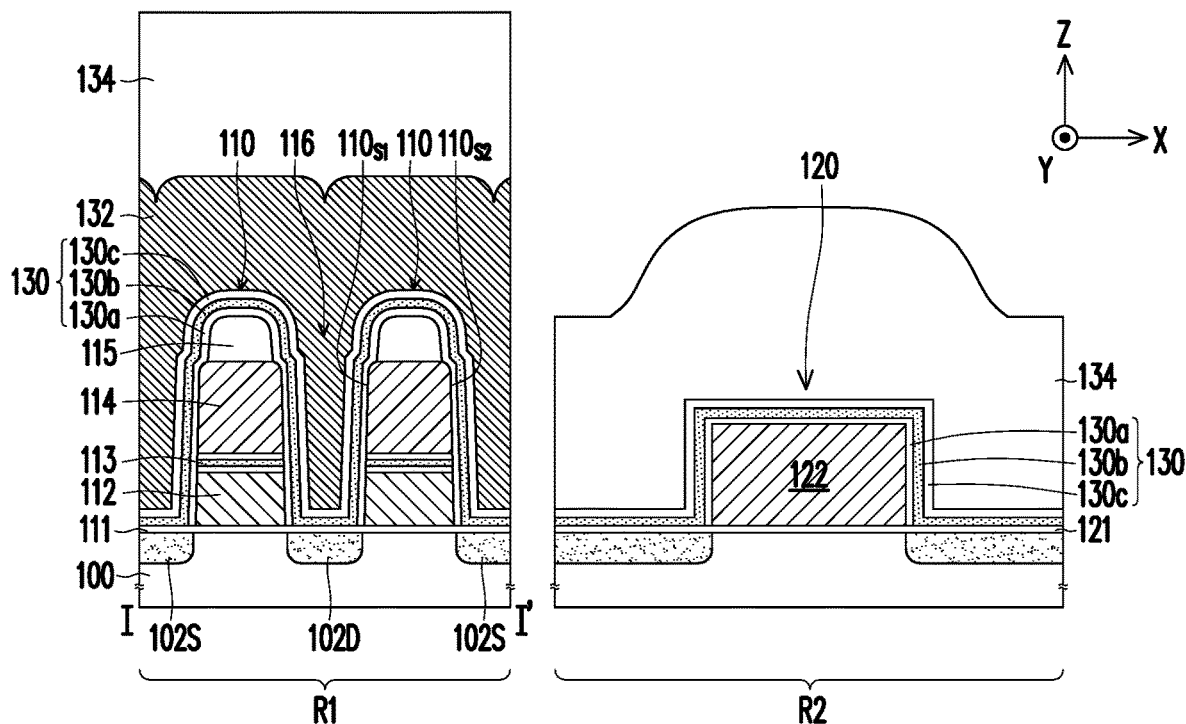

With reference to FIG. 1B, the sacrificial material layer 132 of the peripheral region R2 is removed by lithography and etching processes, and the sacrificial material layer 132 located in the cell region R1 remains. After that, a dielectric layer 134 is formed on the substrate 100 entirely. The dielectric layer 134 is, for example, silicon oxide.

Figure 1C:
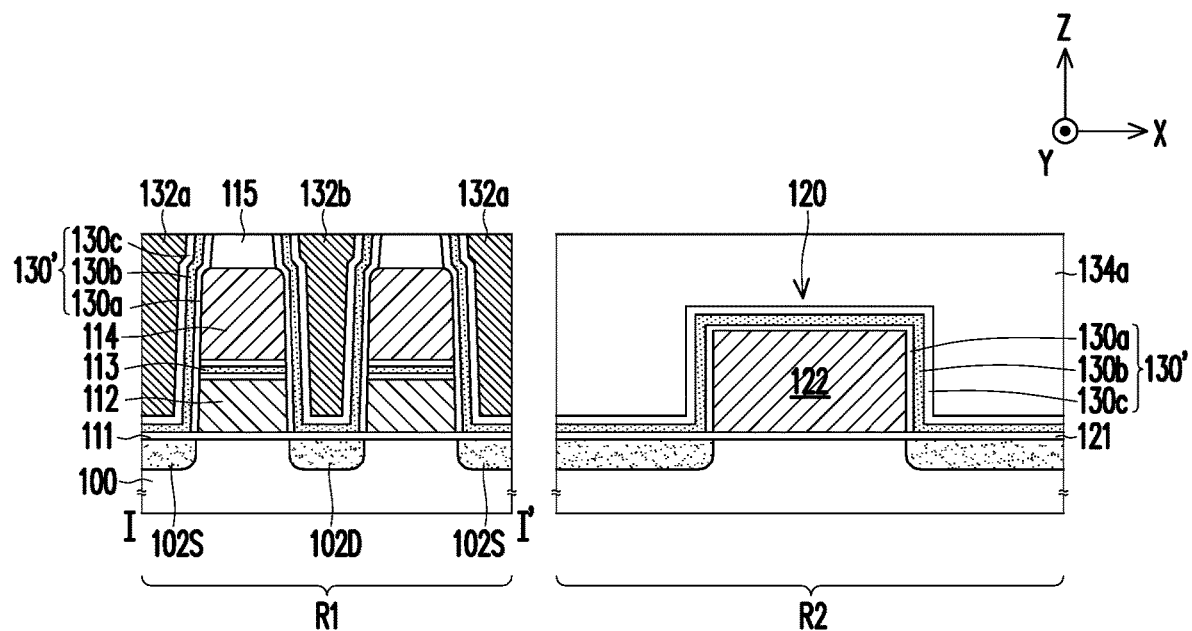

With reference to FIG. 1C, a planarization process is performed on the dielectric layer 134 to remove the liner structure 130, the sacrificial material layer 132, and the dielectric layer 134 above the top cover layer 115, thus forming a sacrificial wall 132a and a liner structure 130' in the cell region R1, and forming a dielectric layer 134a in the peripheral region R2. The top surfaces of the sacrificial wall 132a, the liner structure 130', and the dielectric layer 134a are coplanar. The sacrificial wall 132a extends between the stack structures 110.

Figure 1D:
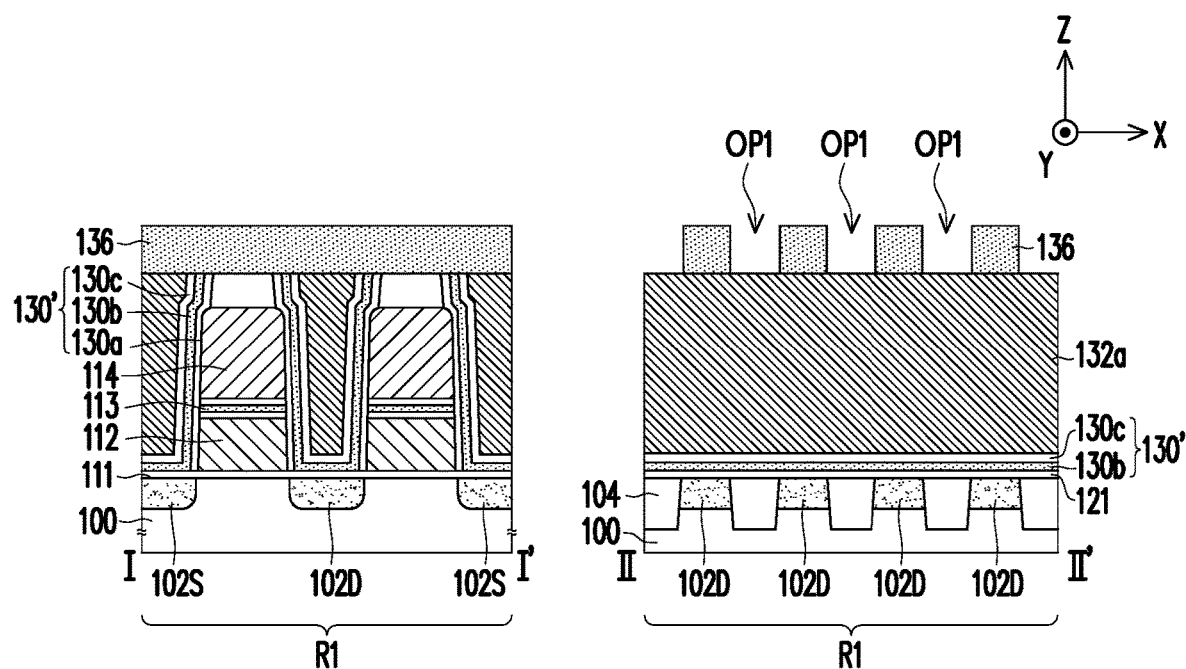
Figure 2B:
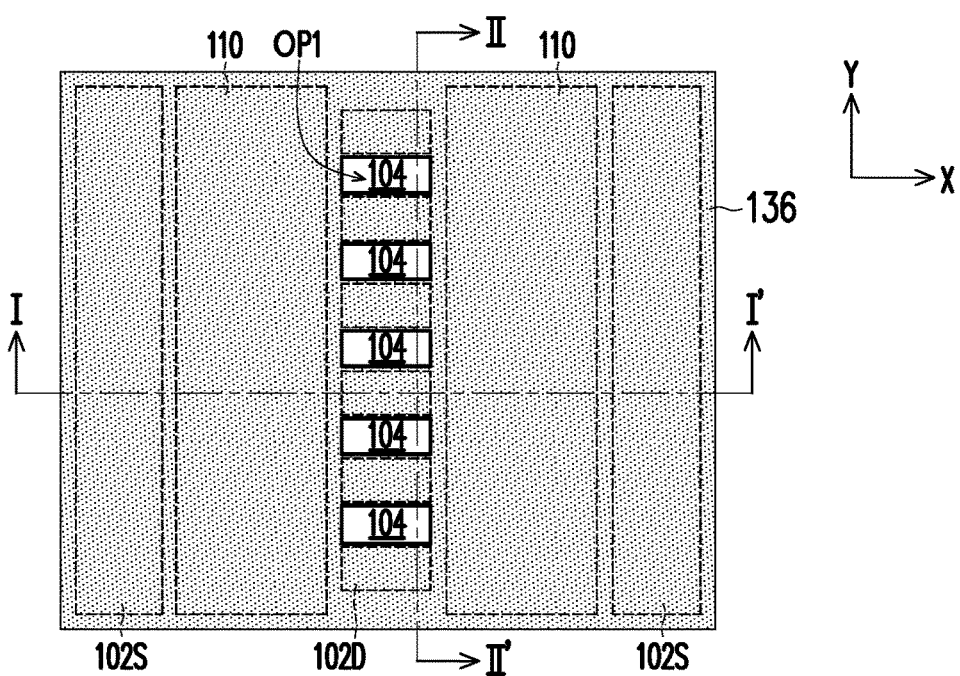

With reference to FIG. 1D and FIG. 2A, a hard mask layer 136 is formed on the substrate 100 of the cell region R1 and the peripheral region R2. The hard mask layer 136 is, for example, silicon nitride. FIG. 1D is a cross-sectional view of line I-I' and line II-IF of FIG. 2B. The hard mask layer 136 is patterned through lithography and etching processes to form a plurality of openings OP1. The openings OP1 expose the sacrificial wall 132a between the stack structures 110 and located above the isolating structure 104 between the drain regions 102D in the cell region R1. The hard mask layer 136 continuously extends on and covers the source region 102S, the stack structure 110, and the sacrificial wall 132a above the drain region 102D. In the cell region R1, only the sacrificial wall 132a exposed by the opening OP1 is exposed. Therefore, even if misalignment occurs, the source region 102S, the stack structure 110, and the upper part of the liner structure 130' may still be covered by the sacrificial wall 132a instead of being exposed.

Figure 1E:
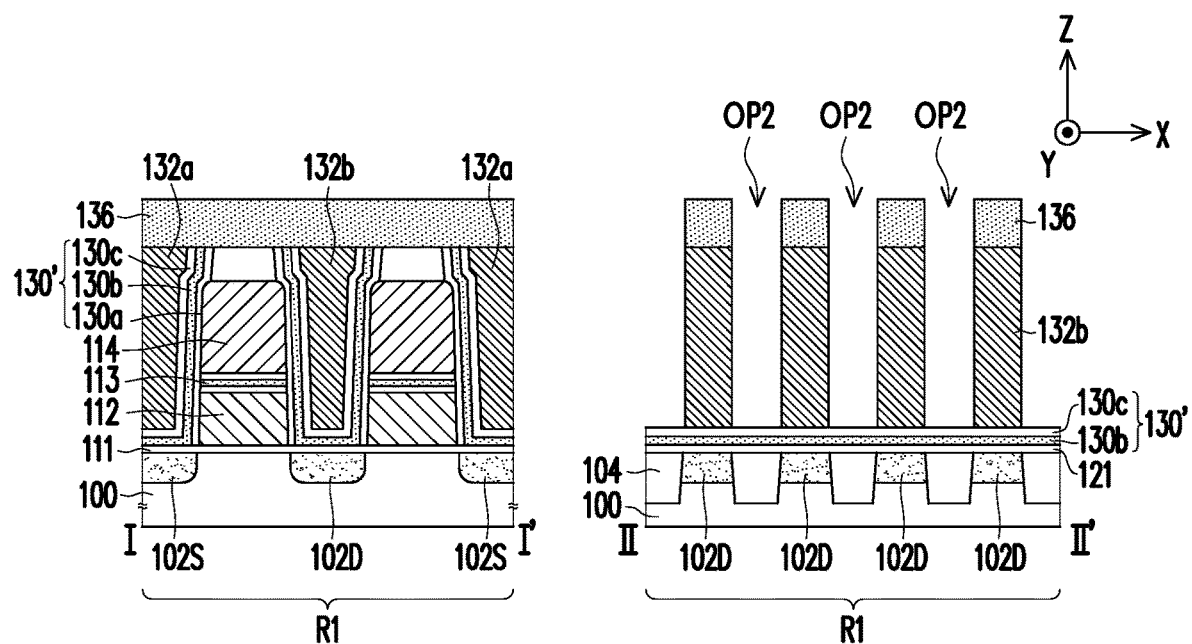

With reference to FIG. 1E, taking the hard mask layer 136 as a mask, an etching process is performed to remove the sacrificial wall 132a exposed by the openings OP1 to form a plurality of openings OP2 and a plurality of sacrificial columns 132b. The openings OP2 expose the liner structure 130' between the stack structures 110 and located above the isolating structure 104. The openings OP2 are arranged into a row in the Y direction. The sacrificial columns 132b are located above the isolating structure and arranged into a row along the Y direction, and are separated from each other by the openings OP2.

If misalignment occurs during lithography, the source area 102S and the upper part of the stack structure 110 may still be covered by the sacrificial wall 132a instead of being exposed. Therefore, during the etching process, the stack structure 110 and the liner structure 130' on a sidewall thereof can be protected from damage by etching, thus preventing damage to the liner structure 130' leading to leakage current caused by an excessively small distance between self-aligned contacts 142a, 142b and the conductive layer (control gate) 114 of the stack structure 110.

Figure 1F:
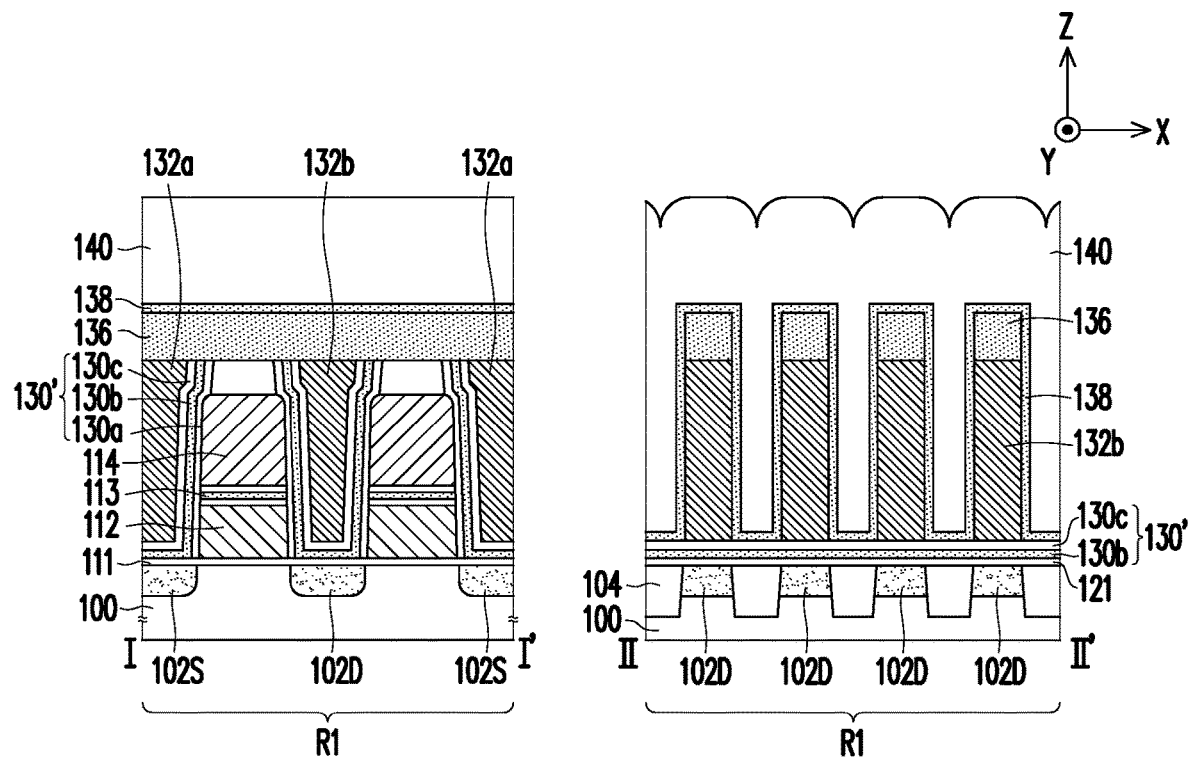

With reference to FIG. 1F, a stop layer 138 and a dielectric layer 140 are sequentially formed on the substrate 100 entirely. The stop layer 138 covers the hard mask layer 136 and is filled in the openings OP2, but does not fill up the openings OP2. The dielectric layer 140 covers the stop layer 138 and is filled in the remaining space of the openings OP2. The stop layer 138 is, for example, silicon nitride, and the dielectric layer 140 is, for example, silicon oxide.

Figure 1G:
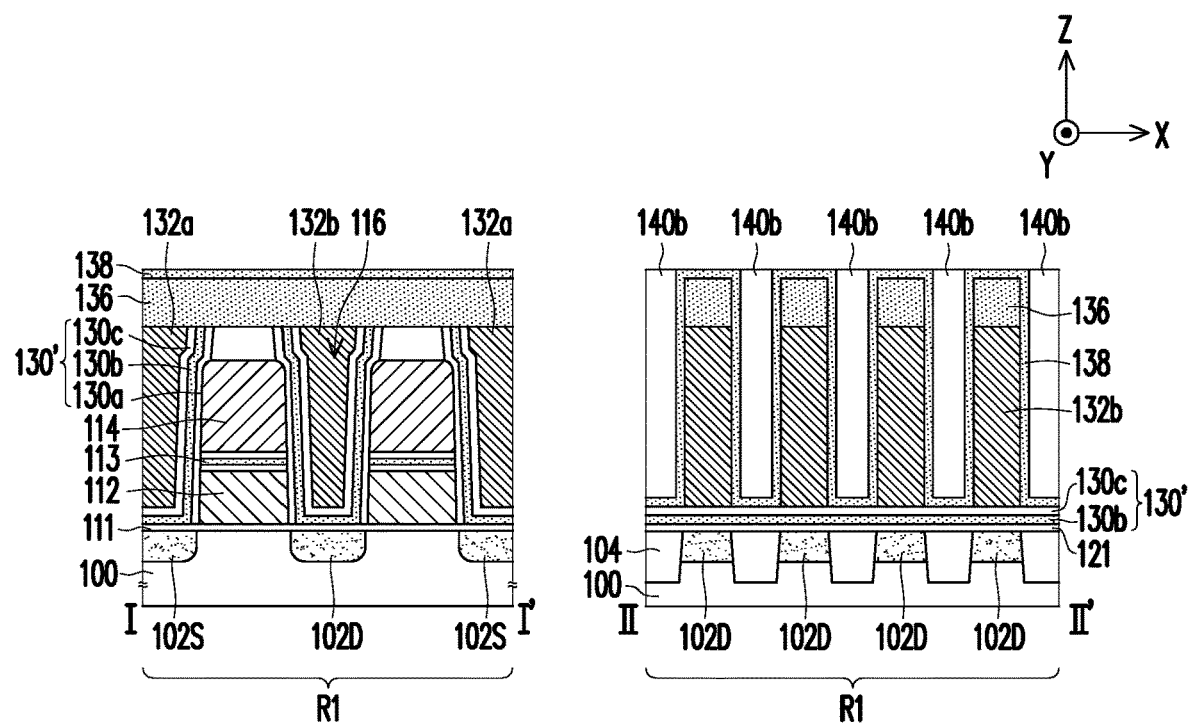

With reference to FIG. 1G, a planarization process, such as a chemical mechanical polishing process, is performed to remove the dielectric layer 140 on the stop layer 138 and to form dielectric columns 140b in the opening OP2, and the dielectric layer 140 (not shown) of the peripheral region remains. The top surface of the dielectric column 140b and the top surface of the stop layer 138 are coplanar.

Figure 1H:
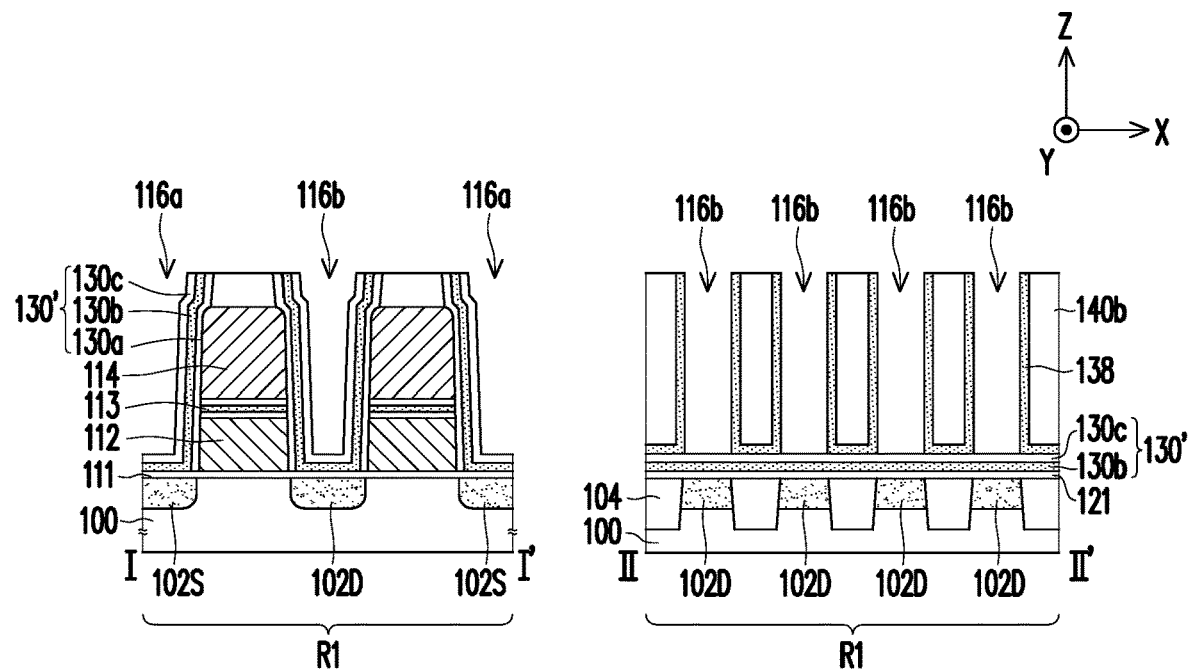

With reference to FIG. 1H, the stop layer 138 and the hard mask layer 136 are removed. Next, a wet etching process is performed to remove the sacrificial wall 132a and the sacrificial columns 132b and form openings 116a and 116b.

The openings 116b and the dielectric columns 140b alternate with each other in the Y direction.

Figure 1I:
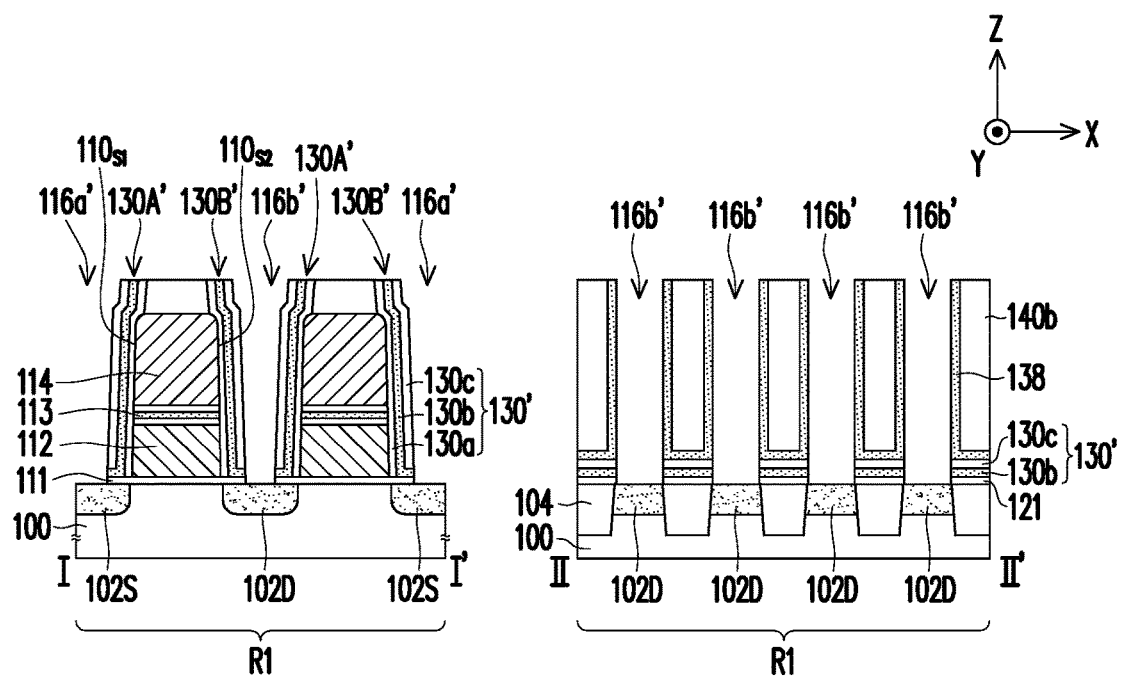

With reference to FIG. 1I, the liner structure 130' and the tunneling dielectric layer 111 at the bottom of the openings 116a and 116b are removed to form openings 116a' and 116b'. The self-aligned contact openings 116a' expose the source regions 102S, and the self-aligned contact openings 116b' expose the drain region 102D. The self-aligned contact openings 116b' and the dielectric columns 140b alternate with each other in the Y direction. The liner structure 130' is separated by the stack structure 110 into liner structures 130A' and 130B'. Since the liner structures 130A' and 130B' are exposed only until this stage, the liner structures 130A' and 130B' extending from the sidewall of the top cover layer 115 of the stack structure 110 downward to the sidewall of the floating gate 112 have approximately the same thickness, instead of leading to a case where the liner structures 130A' and 130B' have a relatively small thickness in a specific region (e.g., the sidewall of the top cover layer 115).

Figure 1J:
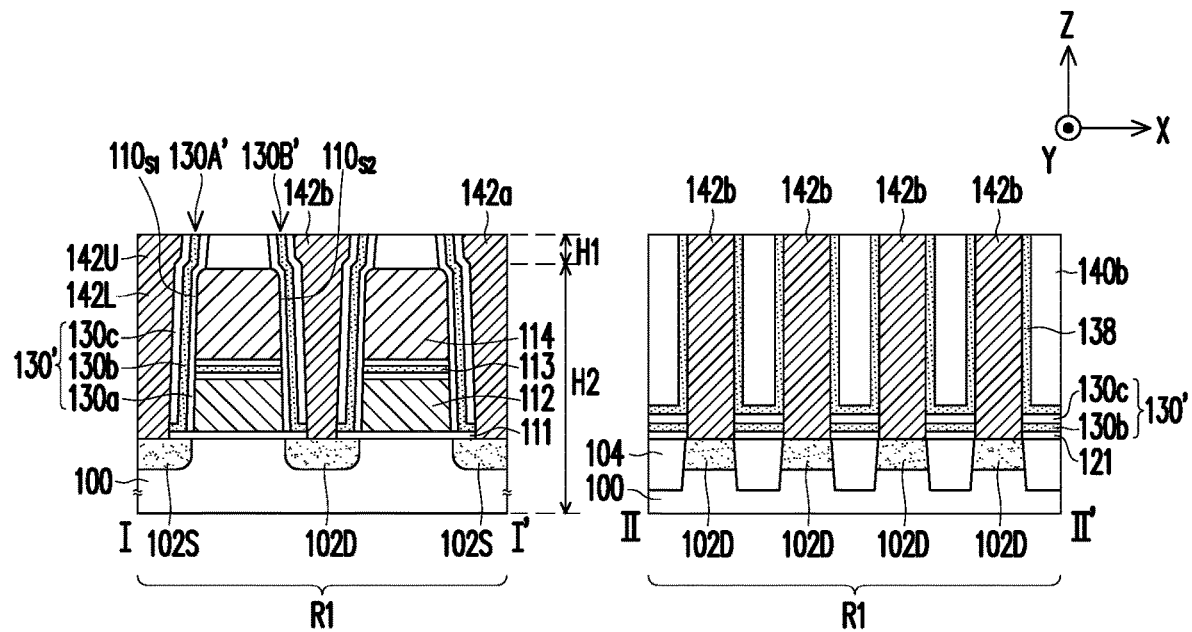

With reference to FIG. 1J, a conductive layer (e.g., tungsten) is formed on the substrate 100 entirely, and the conductive layer is filled in the self-aligned contact openings 116a' and 116b'. Then, a planarization process, such as a chemical mechanical polishing process, is performed on the conductive layer to form the self-aligned contacts 142a and 142b. The top surfaces of the self-aligned contacts 142a and 142b are coplanar with the top surface of the liner structure 130', the top surface of the top cover layer 115, and the top surface of the dielectric layer 134a (shown in FIG. 1C and FIG. 1N). Each self-aligned contact 142a is, for example, a long column continuously extending in the Y direction, and is electrically connected to the source region 102S. The self-aligned contacts 142b are, for example, cylindrical. Moreover, the self-aligned contacts 142b are alternately arranged with the dielectric columns 140b in the Y direction into a row, and are electrically connected to the drain regions 102D.

The self-aligned contacts 142a and 142b each include an upper part 142U and a lower part 142L. The upper part 142U is located in a range from above the top surface of the control gate 114 and the top surface of the top cover layer 115, and has a first height H1. The lower part 142L is connected to the upper part 142U. The lower part 142L is located in a range from beneath the top surface of the control gate 114 and the top surface of the substrate 100, and has a second height H2. The first height H1 is smaller than the second height H2.

Figure 1K:
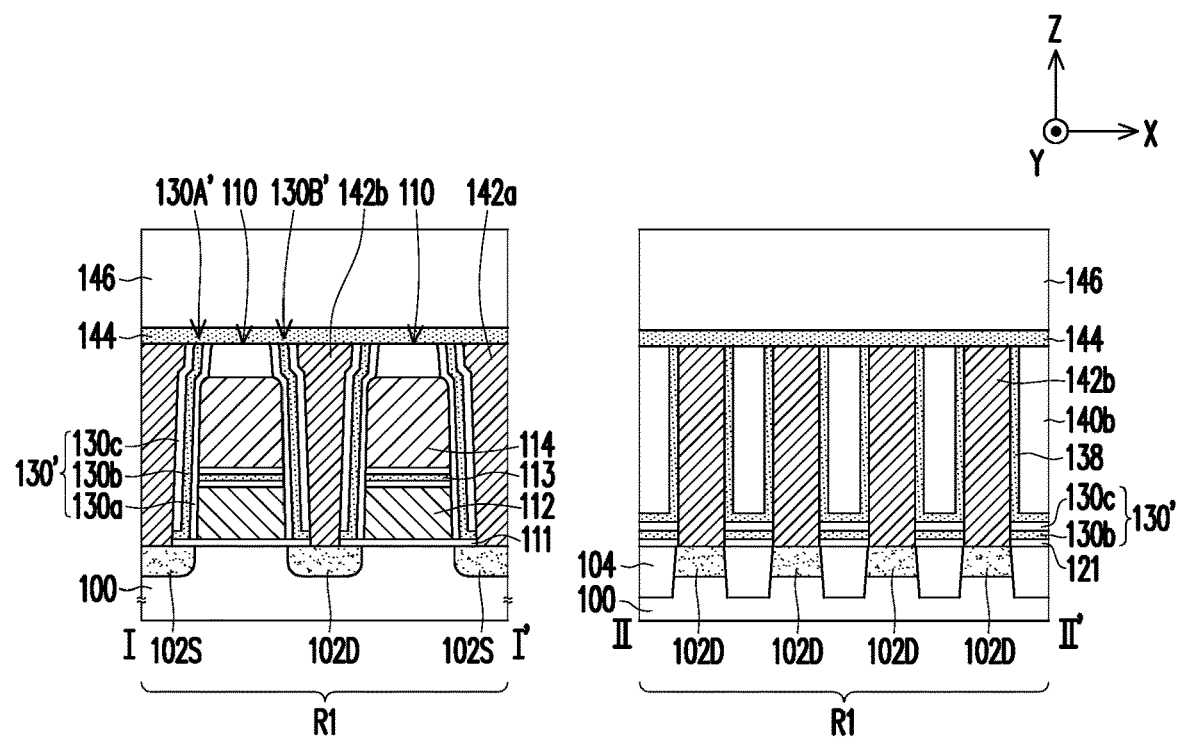
Figure 1L:
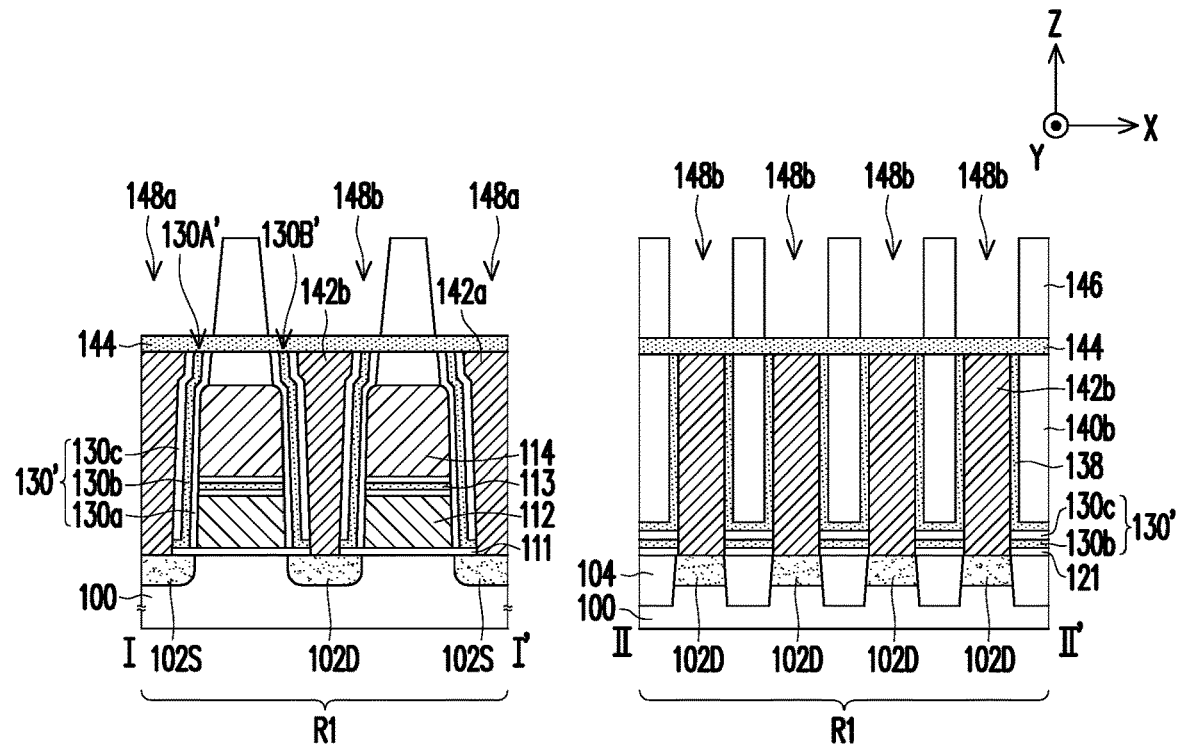
Figure 1M:
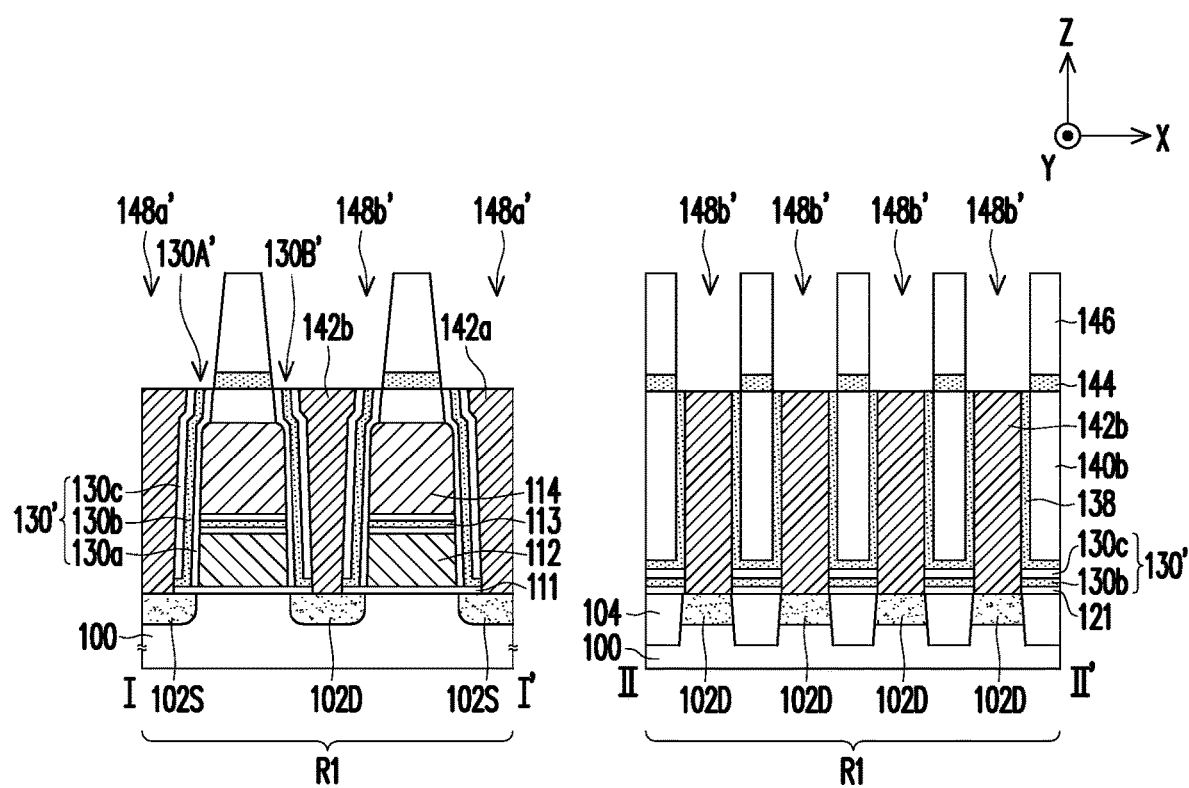
Figure 1N:
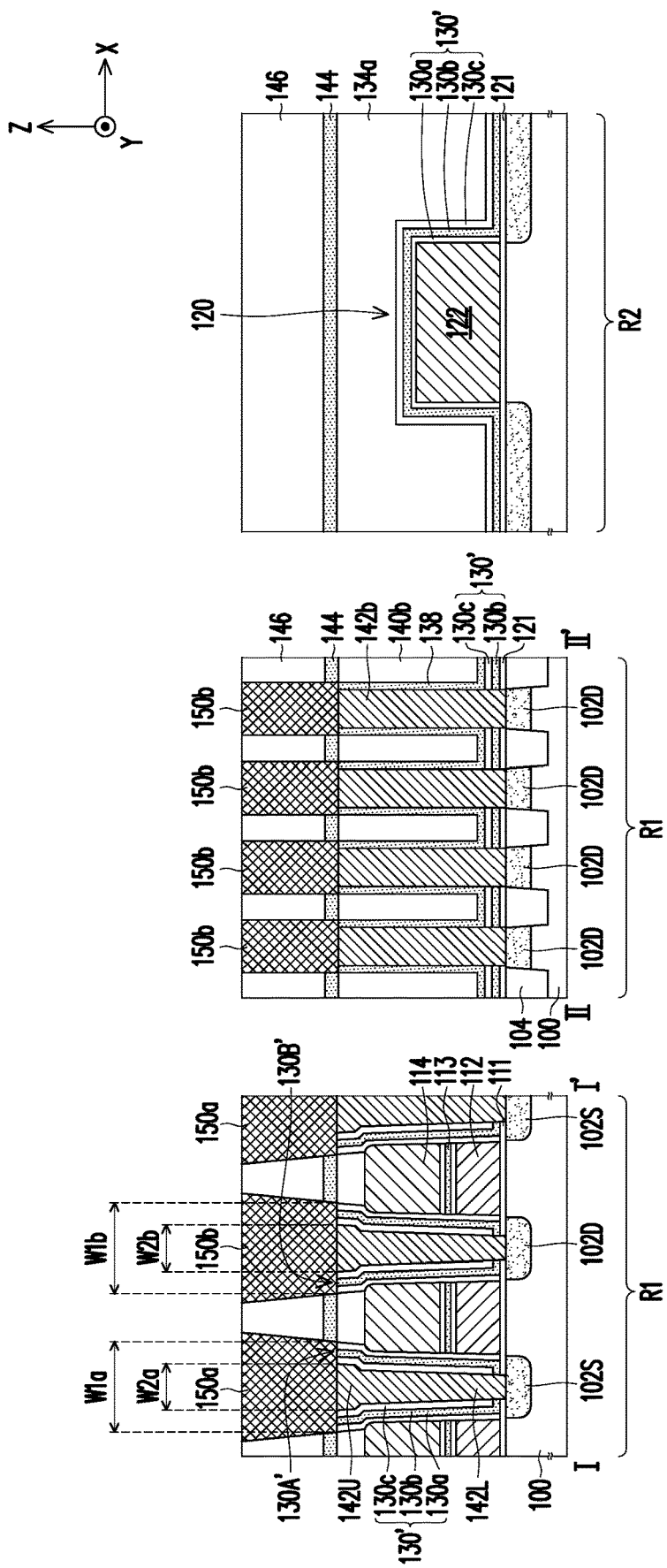

With reference to FIG. 1K and FIG. 1N, a stop layer 144 is formed on the substrate 100. Next, a dielectric layer 146 (FIG. 1K) is formed on the stop layer 144. The stop layer 144 covers the stack structure 110, the liner structure 130', the self-aligned contacts 142a and 142b, and the dielectric layer 134a (shown in FIG. 1C and FIG. 1N). The material of the stop layer 144 includes silicon nitride, and the material of the dielectric layer 146 includes silicon oxide.

With reference to FIG. 1L and FIG. 1M, taking the stop layer 144 as an etching stop layer, lithography and etching processes are performed to form openings 148a and 148b in the dielectric layer 146. Then, the stop layer 144 at the bottom of the openings 148a and 148b is etched to form contact openings 148a' and 148b'. The contact openings 148a' and 148b' expose the top surfaces of the self-aligned contacts 142a and 142b and the top surfaces of the liner structures 130A' and 130B'. When the stop layer 144 is etched, the etching depth may be controlled by the time mode. Therefore, even if the liner structures 130A' and 130B' are etched, it is also possible to control the degree of etching within an appropriate range, so that the liner structures 130A' and 130B' still have a sufficient height. As such, a sufficient distance is present between the subsequently formed contacts 150a and 150b (FIG. 1N) and the control gate 114.

Figure 2C:
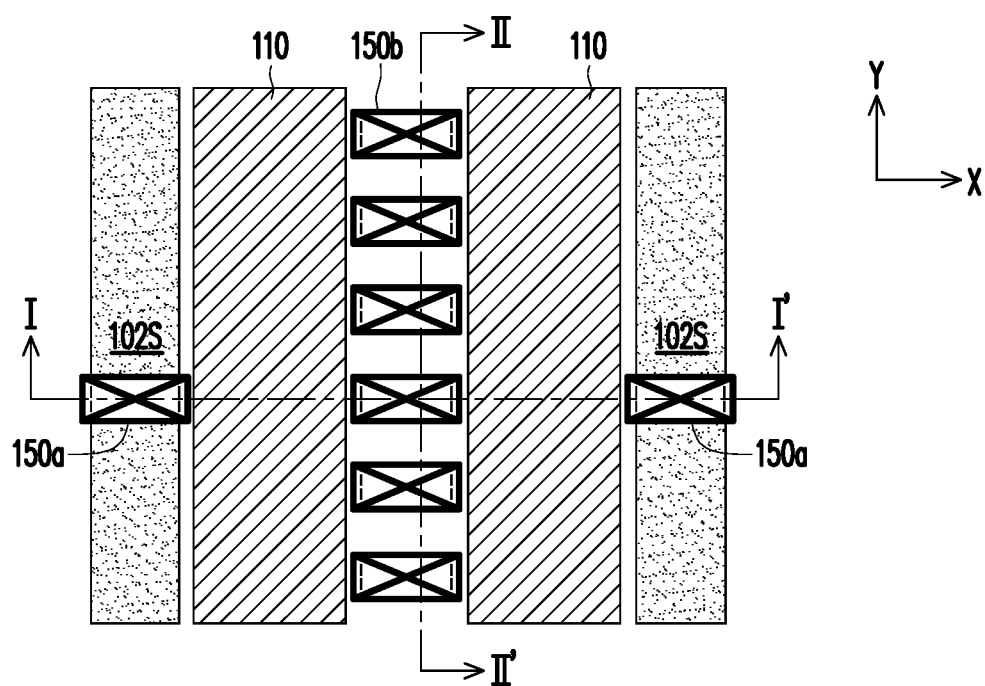

With reference to FIG. 1N, a conductive layer (e.g., tungsten) is formed on the substrate 100 entirely, and the conductive layer is filled in the contact openings 148a' and 148b'. Then, a planarization process, such as a chemical mechanical polishing process, is performed on the conductive layer to form the contacts 150a and 150b. The top surfaces of the contacts 150a and 150b are coplanar with the top surface of the dielectric layer 146. The contacts 150a/150b are electrically connected to the source/drain regions (102S/102D) through the self-aligned contacts 142a/142b. The contacts 150a and 150b may be arranged to appear in the same cross-section or different cross-sections. FIG. 1N shows a cross-sectional view of the cell region R1 and the peripheral region R2 along line I-I' and line II-IF of FIG. 2C.

The contacts 150a and 150b may be in contact with the self-aligned contacts 142a and 142b, and may be in contact with the liner structures 130A' and 130B'. Therefore, a bottom width $W_{1a}$ of the contact 150a in the X direction is greater than a top width $W_{2a}$ of the self-aligned contact 142a in the X direction. A bottom width $W_{1b}$ of the contact 150b in the X direction is greater than a top width $W_{2b}$ of the self-aligned contact 142b in the X direction.

Furthermore, the liner structures 130A' and 130B' do not extend upward to the sidewalls of the contacts 150a and 150b. Therefore, the contacts 150a and 150b are located in the dielectric layer 146 and the stop layer 144 and are in direct contact with the sidewalls of the dielectric layer 146 and the stop layer 144, without the presence of the liner structures 130A' and 130B' in between.

The hard mask layer of the disclosure covers the stack structure and the liner structure of the source region and the drain region, and the opening of the mask layer only exposes the sacrificial material layer above the isolating structure between the drain regions. Therefore, it is possible to prevent the liner structure on the sidewall of the stack structure from being etched, which causes thinning, thus preventing leakage current caused by an excessively small distance between the self-aligned contact and the control gate of the stack structure. Therefore, in the method of the disclosure, when the self-aligned contact is formed, a large process window can be present, and the reliability of the device can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A memory device, comprising:
a substrate having a plurality of isolating structures;
a first source/drain region and a plurality of second source/drain regions located in the substrate;
a stack structure located on the substrate between the first source/drain region and the plurality of second source/drain regions;
a first dielectric layer located on the substrate, wherein the first dielectric layer comprises a plurality of dielectric columns separated from each other, and the plurality of dielectric columns are located on the isolating structures;

a first self-aligned contact located on the substrate and connected to the first source/drain region;

a plurality of second self-aligned contacts located between the plurality of dielectric columns on the substrate and connected to the plurality of second source/drain regions;

a first liner structure located between the first self-aligned contact and a first sidewall of the stack structure; and a second liner structure located between the plurality of second self-aligned contacts and a second sidewall of the stack structure, wherein the first liner structure and the second liner structure are not connected, and do not cover the stack structure, wherein the first liner structure and the second liner structure are dielectric materials, wherein a top surface of the first liner structure and a top surface of the second liner structure are coplanar with a top surface of the plurality of first self-aligned contacts and a top surface of the plurality of second self-aligned contacts.

2. The memory device according to claim 1, wherein the stack structure comprises:

a floating gate located above the substrate;

a tunneling dielectric layer located between the floating gate and the substrate;

a control gate located above the floating gate;

an inter-gate dielectric layer located between the floating gate and the control gate; and a top cover layer located on the control gate.

3. The memory device according to claim 2, wherein the top surface of the first liner structure and the top surface of the second liner structure are coplanar with a top surface of the top cover layer of the stack structure.

4. The memory device according to claim 2, wherein the first liner structure and the second liner structure are multilayer structures continuously extending from a sidewall of the floating gate to a sidewall of the top cover layer.

5. The memory device according to claim 2, wherein the first self-aligned contact and the second self-aligned contact each comprise:

an upper part located in a range from above a top surface of the control gate and a top surface of the top cover layer; and a lower part connected to the upper part and located in a range from beneath the top surface of the control gate and a top surface of the substrate.

6. The memory device according to claim 1, further comprising:

a second dielectric layer covering the first dielectric layer and the stack structure;

a first contact located in the second dielectric layer and connected to the first self-aligned contact, wherein a bottom width of the first contact is greater than a top width of the first self-aligned contact; and a plurality of second contacts located in the second dielectric layer and respectively located on the plurality of second self-aligned contacts, wherein a bottom width of the plurality of second contacts is greater than a top width of the plurality of second self-aligned contacts.

7. The memory device according to claim 6, wherein a bottom surface of the first contact is in contact with the top surface of the first liner structure, and a bottom surface of the plurality of second contacts is in contact with the top surface of the second liner structure.

8. The memory device according to claim 7, wherein the first liner structure does not extend between the second dielectric layer and the first contact, and the second liner structure does not extend between the second dielectric layer and the second contact.

9. The memory device according to claim 7, further comprising:

a stop layer located between the second dielectric layer and the first dielectric layer and between the second dielectric layer and the stack structure.

10. The memory device according to claim 9, wherein the first contact and the plurality of second contacts are each in contact with a sidewall of the second dielectric layer and a sidewall of the stop layer.

11. The memory device according to claim 2, wherein a top width of the control gate is greater than a bottom width of the top cover layer.

12. The memory device according to claim 9, wherein the first dielectric layer, the stop layer, and the second dielectric layer further extend to cover a peripheral region of the substrate.

* * * * *